(12) United States Patent
Takano et al.

(10) Patent No.: US 7,283,796 B2
(45) Date of Patent: Oct. 16, 2007

(54) ELECTRONIC TUNING SYSTEM

(75) Inventors: Yoh Takano, Gifu-ken (JP); Fumihiro Sasaki, Gunma-ken (JP)

(73) Assignee: Sanyo Electric Co., Ltd, Moriguchi-shi (JP)

( * ) Notice: Subject to any disclaimer, the term of this patent is extended or adjusted under 35 U.S.C. 154(b) by 446 days.

(21) Appl. No.: 09/991,749

(22) Filed: Nov. 26, 2001

(65) Prior Publication Data

US 2002/0065056 A1    May 30, 2002

(30) Foreign Application Priority Data

Nov. 29, 2000  (JP)  ............... 2000-362252

(51) Int. Cl.
*H04B 1/18*   (2006.01)

(52) U.S. Cl. ............... 455/180.4; 455/180.3; 455/185.1; 455/150.1; 455/255; 455/179.1; 455/169.1; 455/77

(58) Field of Classification Search ........... 455/180.4, 455/571, 169.1, 169.2, 179.1, 180.3, 185.1, 455/186.1, 189.1, 260, 255, 258, 343.1, 343.2, 455/343.3, 343.4, 343.5, 343.6; 365/185.22; 711/103, 155

See application file for complete search history.

(56) References Cited

U.S. PATENT DOCUMENTS 4,225,823 A * 9/1980 Ogita ............... 455/226.1
4,919,640 A * 4/1990 Yanagibori ............... 455/164.1
5,881,364 A * 3/1999 Higuchi ............... 340/7.2
6,240,019 B1 * 5/2001 Shiga et al. ........... 365/185.22
6,636,727 B2 * 10/2003 Muschallik et al. ........ 455/260

FOREIGN PATENT DOCUMENTS

| JP | 5-46121 | | 6/1993 |
| JP | 05046121 U | * | 6/1993 |
| JP | 06-203584 | | 7/1994 |
| JP | 06203584 A | * | 7/1994 |

OTHER PUBLICATIONS

Notification of Reasons for Rejection, Japan Patent Office, Application No. 2000-362252, mailed Dec. 20, 2005 (With English language translation).

* cited by examiner

*Primary Examiner*—Charles N. Appiah
*Assistant Examiner*—Willie J. Daniel, Jr.
(74) *Attorney, Agent, or Firm*—Westerman, Hattori, Daniels & Adrian, LLP.

(57) ABSTRACT

An electronic tuning system includes an electronic tuner for adjusting the predetermined control voltage of a voltage controlled oscillator (VCO) to tune the local frequency signal to radio waves on an arbitrary channel in accordance with channel selection information. A booster circuit boosts a source voltage to generate a boosted voltage in order to ensure the predetermined control voltage. A non-volatile memory stores the channel selection information in response to a predetermined write voltage. The boosted voltage of the booster circuit is utilized as the predetermined write voltage.

9 Claims, 3 Drawing Sheets

ELECTRONIC TUNING SYSTEM

BACKGROUND OF THE INVENTION

The present invention relates to an electronic tuning system, and more particularly, to an electronic tuning system which comprises an electronic tuner for tuning to radio waves on a broadcast channel of television broadcasting, radio broadcasting and the like, or a local channel used in a variety of radio devices.

As is well known, in the television broadcasting and radio broadcasting, respective broadcasting stations are assigned radio waves in different frequency bands from one another as broadcast channels. Thus, on the receiver side, radio waves on a desired broadcast channel are selectively received to enjoy contents of broadcasting provided by a desired broadcasting station.

Generally, a receiver for receiving radio waves on a particular channel is configured in the following manner. A received signal received through an antenna is mixed with a local frequency signal supplied from a local oscillator by a mixer. A signal generated from the sum or the difference of the two signals by a mixer is supplied to an intermediate frequency filter. The intermediate frequency filter selectively supplies a detector circuit only with a signal having an intermediate frequency. The detector circuit demodulates the received signal corresponding to a predetermined broadcast channel.

The receiver comprises an electronic tuner for selecting a desired broadcast channel. The electronic tuner adjusts (tunes) a frequency band of the local frequency signal supplied from the local oscillator such that only the received signal on the desired broadcast channel passes through the intermediate frequency filter. The electronic tuner has a voltage controlled oscillator (VCO) including a local oscillator, and controls a voltage applied to the voltage controlled oscillator to control the frequency band of the local frequency signal output from the oscillator.

In an electronic tuning system comprising an electronic tuner, channel selection information on a broadcast channel selected through a voltage controlled oscillator (frequency information or tuning control information) is stored in a memory, such that the channel selection information stored in the memory is read upon next channel selection to permit prompt tuning to the broadcast channel. For this reason, the channel selection (tuning control) and writing the channel selection information into the memory have been previously performed for a plurality of broadcast channels, so that the selection of an arbitrary broadcast channel can be instantaneously made through an extremely simple operation of reading such channel selection information from the memory.

Generally, memories used in such electronic tuning systems often require a sustain current for a RAM (Random Access Memory) or the like. Therefore, when such an electronic tuning system is equipped in a portable device driven by a battery such as a dry battery, the following disadvantages will result.

Specifically, a device which employs a dry battery as a power source such as a portable device essentially involves replacement of dry batteries when the device is used for a long time. However, the replacement of batteries results in interruption of the sustain current, so that information stored in a memory is erased. In such a situation, after the replacement of batteries, the user is forced to perform complicated operations which involves selecting (tuning) each broadcast channel and writing the channel selection information into the memory.

SUMMARY OF THE INVENTION

It is an object of the present invention to provide an electronic tuning system which prevents erasure of information on channels selected through electronic tuning.

In one aspect of the present invention, an electronic tuning system is provided. The system includes a voltage controlled oscillator for generating a local frequency signal having a frequency according to a predetermined control voltage. An electronic tuner is coupled to the voltage controlled oscillator for adjusting the predetermined control voltage to tune the local frequency signal to radio waves on an arbitrary channel in accordance with channel selection information. A booster circuit is coupled to the voltage controlled oscillator for boosting a source voltage to generate a boosted voltage in order to ensure the predetermined control voltage. A non-volatile memory stores the channel selection information in response to a predetermined write voltage. The boosted voltage of the booster circuit is utilized as the predetermined write voltage.

In another aspect of the invention, a radio receiver is provided. The radio receiver includes a voltage controlled oscillator for generating a local frequency signal having a frequency in accordance with a predetermined control voltage. A mixer is coupled to the voltage controlled oscillator for mixing a received signal with a local frequency signal to generate a mixed frequency signal. An intermediate frequency filter is coupled to the mixer for filtering the mixed frequency signal to generate an intermediate frequency signal. A detector circuit is coupled to the intermediate frequency filter for demodulating the intermediate frequency signal to an audio signal. An electronic tuner is coupled to the voltage controlled oscillator for adjusting the predetermined control voltage to tune the local frequency signal to radio waves on an arbitrary channel in accordance with channel selection information. A booster circuit is coupled to the voltage controlled oscillator for boosting a source voltage to generate a boosted voltage in order to ensure a predetermined control voltage. A non-volatile memory stores the channel selection information in accordance with a predetermined write voltage. The boosted voltage of the booster circuit is utilized as the predetermined write voltage.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
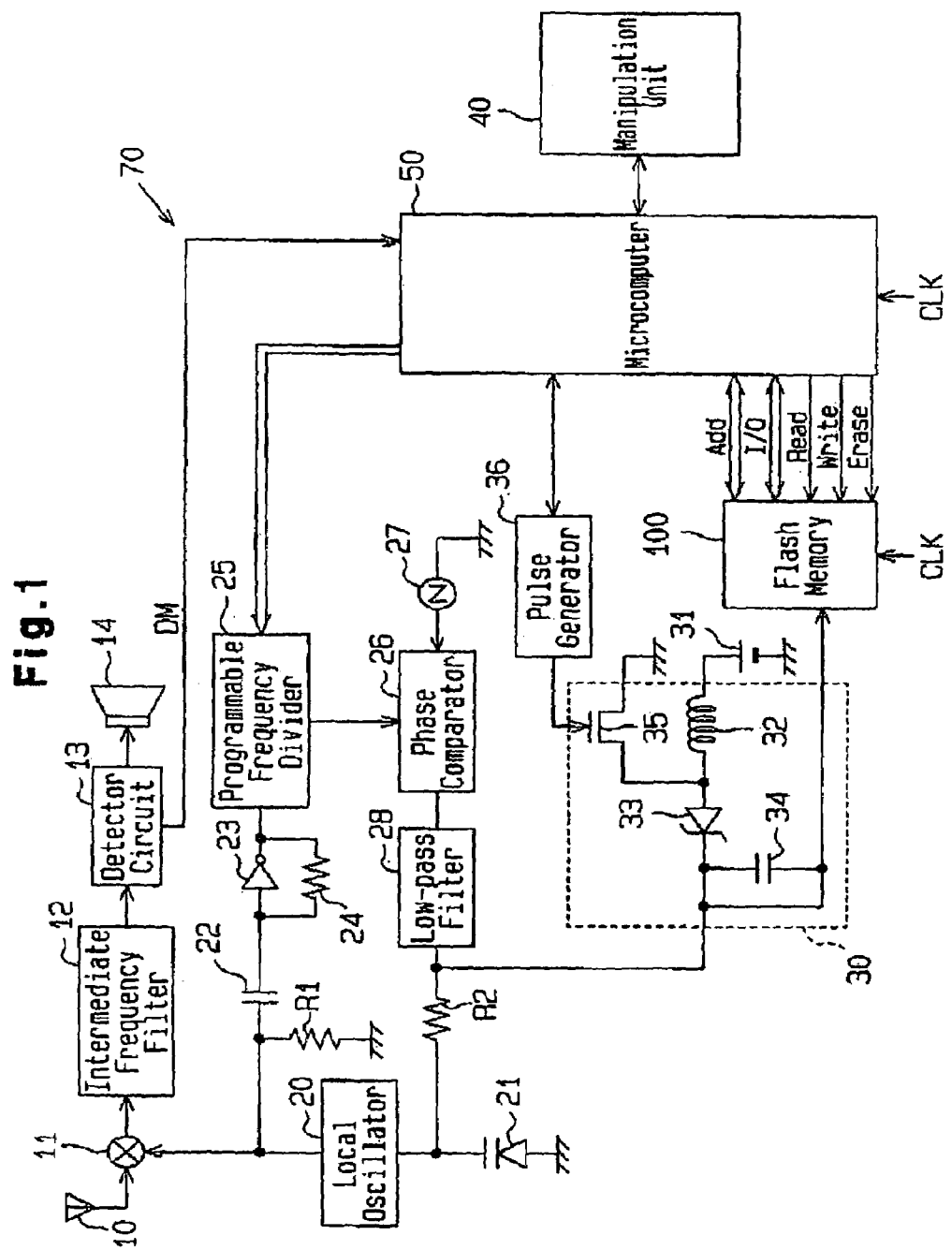
FIG. 1 is a schematic block diagram of a portable radio receiver according to a first embodiment of the present invention.

In the drawings, like numerals are used for like elements throughout.

In the following, a portable radio receiver 70 according to a first embodiment of the present invention will be described with reference to the drawings. An electronic tuning system of the present invention is applied to the portable radio receiver 70.

As illustrated in FIG. 1, the radio receiver 70 converts a received signal into an intermediate frequency signal having a predetermined intermediate frequency, demodulates the intermediate frequency signal, and retrieves an audio signal from radio waves on a desired broadcast channel. The radio receiver 70 comprises an antenna 10; a mixer 11 for mixing a received signal received by the antenna 10 with a local oscillating frequency signal supplied from a local oscillator 20; an intermediate frequency filter 12 which passes therethrough only an intermediate frequency signal from the mixed frequency signal output from the mixer 11; a detector circuit 13 for demodulating the intermediate frequency signal supplied from the intermediate frequency filter 12 to an audio signal; and a speaker 14 (audio circuit) for outputting sound in accordance with the audio signal demodulated by the detector circuit 13.

Next described will be a sequence of operations from the demodulation of the received signal received by the antenna 10 to delivery of sound from the speaker 14.

First, the mixer 11 subtracts the frequency of the received signal received by the antenna 10 from the frequency of the local frequency signal oscillated from the local oscillator 20 to generate a mixed frequency signal having the frequency resulting from the subtraction. The intermediate frequency filter 12 supplies the detector circuit 13 only with a signal in a predetermined intermediate frequency band from among the mixed frequency signal.

The detector circuit 13 demodulates the intermediate frequency signal to generate an audio signal irrespective of the frequency band of a broadcast channel to be selected. The speaker 14 outputs sound in accordance with the audio signal. The detector circuit 13 also generates information indicating whether the intermediate frequency signal includes an audio signal from an arbitrary broadcasting station.

The frequency of the local frequency signal oscillated from the local oscillator 20 is set by adding the intermediate frequency to the frequency of a desired broadcast channel, so that only a signal at the frequency of the desired broadcast channel is selectively demodulated. For changing a broadcast channel, the frequency band of the local frequency signal output from the local oscillator 20 is also changed (tuned). This change results in a change in signal components of the received signal received by the antenna 10 which pass through the intermediate frequency filter 12, so that an audio signal corresponding to the changed broadcast channel is demodulated in the detector circuit 13.

The frequency of the local oscillating signal output from the local oscillator 20 is changed by changing the resonant frequency of the local oscillator 20 in accordance with the capacitance of a varactor diode 21 coupled between the local oscillator 20 and a ground. The capacitance of the varactor diode 21 is changed in accordance with a voltage applied to a cathode of the varactor diode 21. Specifically, in this embodiment, a voltage controlled oscillator is formed by the local oscillator 20 and the varactor diode 21. Then, the foregoing tuning operation is implemented by controlling the oscillating frequency of the voltage controlled oscillator.

Next, the tuning operation will be described.

In this embodiment, a PLL (Phase Locked Loop) method is employed as a tuning method for tuning the local frequency of the local oscillator 20 to the sum of a desired frequency and the intermediate frequency. Specifically, the local frequency of the local oscillator 20 is divided in a ratio of the sum of the desired frequency and the intermediate frequency to a reference frequency to generate a divided frequency signal, and the voltage controlled oscillator is feedback controlled such that the frequency of the divided frequency signal matches the reference frequency.

Specifically, a direct current (DC) component of the local frequency signal output from the local oscillator 20 is cut by a DC cut capacitor 22, which is in parallel with resistor R1, and the local frequency signal deprived of the DC component is amplified by a parallel circuit comprised of an inverter 23 and a resistor 24. A programmable frequency divider 25 divides the amplified local frequency signal by a predetermined division ratio to generate a divided local frequency signal. The predetermined division ratio is calculated by dividing the sum of the desired frequency and the intermediate frequency by the reference frequency. A phase comparator 26 compares the phase and frequency of the divided local frequency signal with the phase and frequency of the reference frequency signal output from a reference oscillator 27.

The phase comparator 26 generates an average DC voltage signal which is proportional to the phase difference and the frequency difference. A low-pass filter 28 removes an alternating current (AC) component of the average DC voltage signal to generate a filtered average DC voltage signal. The filtered average DC voltage signal is applied to the cathode of the varactor diode 21 via resistor R2.

A boosted voltage (for example, "15 V") from a booster circuit 30 is added to the voltage of the filtered average DC voltage signal from the low-pass filter 28. In other words, the cathode of the varactor diode 21 is applied with a voltage which varies in a range of "zero to the boosted voltage" in accordance with the output voltage of the low-pass filter 28.

When the varactor diode 21 is applied with a voltage which varies in accordance with the phase difference and the frequency difference in the foregoing manner, the frequency of the local frequency signal output from the local oscillator 20 also changes in accordance with the phase difference and frequency difference. Eventually, a feedback control is conducted to reduce the phase difference and frequency difference to "0." In this way, the frequency of the frequency signal output from the local oscillator 20 is locked to the frequency generated by adding the intermediate frequency to the desired frequency.

Next, the booster circuit 30 will be described.

As illustrated in FIG. 1, the booster circuit 30 is preferably a DC-DC converter which makes use of inductive electromotive force of a coil for boosting. Specifically, a counter electromotive force is generated by suddenly changing a current flowing from a battery (dry battery) 31, for example, having a source voltage of "1.5 V" to a coil 32. This counter-electromotive force is clamped to a predetermined voltage equal to or higher than the source voltage, and the clamped voltage is smoothed by a capacitor Here, the current flowing through the coil 32 is suddenly changed by periodically turning ON/OFF a transistor 35, which serves as a switching element, to periodically conduct the DC current flowing through the coil 32 to the ground. Specifically, the transistor 35 has a source terminal coupled to a node between the coil 32 and a zener diode 33, and a drain terminal of the transistor 35 is grounded. A pulse signal is applied to a gate terminal of the transistor 35 from a pulse generator 36 to synchronously conduct the current flowing through the coil 32 to the ground to cause a sudden change in the current through the coil 32.

For clamping the electromotive force induced in the coil 32 by such a change in current, the zener diode 33 having a breakdown voltage set, for example, at "15 V" is used. The voltage clamped by the zener diode 33 is smoothed by the capacitor 34. In this case, a boosted output (boosted voltage) by the booster circuit 30 is "15 V" corresponding to the breakdown voltage of the zener diode 33. This boosted voltage is added to the output voltage of the low-pass filter 28.

Next, description will be made on automatic broadcast channel tuning performed in the receiver 70 of FIG. 1 by the electronic tuner including the mixer 11, the intermediate frequency filter 12, the detector circuit 13, and the PLL as described above.

When a broadcast channel search instruction is supplied to a microcomputer 50 through a manipulation on a manipulation unit 40 by the operator, the microcomputer 50 gradually changes the frequency division ratio for the programmable frequency divider 25. Specifically, the microcomputer 50 is supplied with a signal DM indicating whether a received signal on a broadcast channel has been supplied from the detector circuit 13, and the microcomputer 50 changes the frequency division ratio for the programmable frequency divider 25 based on the signal DM until a received signal on the broadcast channel is received.

When the microcomputer 50 receives the signal DM indicating that a received signal on a broadcast channel is supplied from the detector circuit 13, the microcomputer 50 displays on a display (not shown) that a particular broadcast channel has been received, for example, through the manipulation unit 40. When the microcomputer 50 is supplied with a broadcast channel store instruction from the manipulation unit 40 through a manipulation on the manipulation unit 40 by the operator, the microcomputer 50 stores the value of the frequency division ratio currently supplied to the programmable frequency divider 25 in a flash memory 100 as broadcast channel selection information. Subsequently, when this broadcast channel is selected through a manipulation on the manipulation unit 40 by the operator, the microcomputer 50 reads the value of the frequency division ratio (channel selection information) corresponding to the selected broadcast channel, and supplies the read value of the frequency division ratio to the programmable frequency divider 25. Thus, the broadcast channel is tuned promptly. Likewise, for other broadcast channels, channel selection information (frequency division ratio) is stored in the flash memory 100, and the selection information (frequency division ratio) is read from the flash memory 100.

The flash memory 100, which is an electrically erasable and programmable read only memory (EEPROM), stores the channel selection information. Therefore, even if the power to the memory 100 is interrupted due to replacement of the battery (dry battery) 31, the selection information stored in the memory 100 is not erased but held therein.

For erasing data in the flash memory 100 or writing data thereinto, a high voltage of approximately 12 to 15 V is required. In this embodiment, the boosted voltage from the booster circuit 30 is utilized as a data erasing voltage or a data writing voltage.

Figure 2:
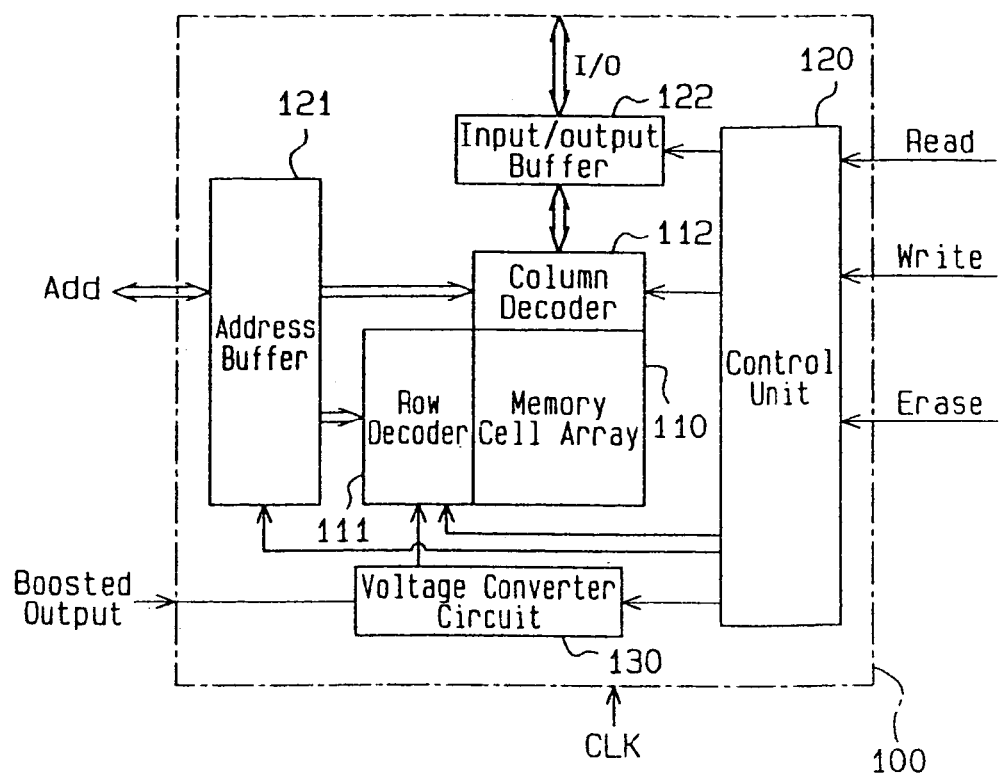
FIG. 2 is a schematic block diagram of a flash memory of the radio receiver of FIG. 1.

Next, the configuration of the flash memory 100 will be described with reference to FIG. 2.

The flash memory 100 comprises a memory array 110 in which a plurality of memory cells are arranged in rows and columns. Word lines and source lines associated with the respective memory cells are coupled to a row decoder 111, and bit lines associated with respective memory cells are coupled to a column decoder 112.

The row decoder 111 applies the source lines with a high voltage (for example, "12 V") for writing, and applies the word lines with a high voltage (for example, "15 V") for erasure. A voltage converter circuit 130 receives the boosted voltage from the booster circuit 30 to generate the high voltage supplied to the row decoder 111.

The column decoder 112 reads data from a memory cell through a bit line, and writes data held by an input/output buffer 122 into a memory cell.

An address buffer 121 once holds address data for a memory cell specified by the microcomputer 50, and supplies the address data to the row decoder 111 and the column decoder 112 at a predetermined timing specified by a control unit 120.

Now, description will be made on a read, a write and an erase mode of the flash memory 100.

In the read mode, the address buffer 121 is supplied with address data Add, from the microcomputer 50, indicative of the location of a memory cell from which data is to be read, and the control unit 120 is supplied with a read instruction Read. Then, the address buffer 121 once holds the address data of the specified memory cell, and supplies the row decoder 111 and the column decoder 112 with the address data at a predetermined timing specified by the control unit 120. The row decoder 111 activates a word line of a predetermined row in accordance with the address data. The column decoder 112 supplies the input/output buffer 122 with data on a bit line of a predetermined column in accordance with the address data. The data supplied to the input/output buffer 122 in this way is captured into the microcomputer 50 through a data bus (I/O).

In the write mode, the address buffer 121 is supplied with address data Add, from the microcomputer 50, indicative of the location of a memory cell into which data is to be written, the input/output buffer 122 is supplied with write data through the data bus (I/O), and the control unit 120 is supplied with a write instruction Write. Then, the address buffer 121 once holds the address data of the specified memory cell, and supplies the row decoder 111 and the column decoder 121 with the address data at a predetermined timing specified by the control unit 120. The voltage converter circuit 130 step-downs the output voltage of the booster circuit 30 to "12 V" in response to an instruction from the control unit 120, and supplies the step-down voltage to the row decoder 111. The row decoder 111 applies a source line coupled to the specified memory cell with the step-down voltage supplied from the voltage converter circuit 130. The column decoder 112 applies a bit line coupled to the specified memory cell with a voltage corresponding to write data. In this way, the data is written into the predetermined memory cell.

In the erase mode, the address buffer 121 is supplied with address data Add, from the microcomputer 50, indicative of the location of a memory cell from which data is to be erased, and the control unit 120 is supplied with an erase instruction Erase. The address buffer 121 once holds the address data of the specified memory cell, and supplies the row decoder 111 with the address data at a predetermined timing specified by the control unit 120. The voltage converter circuit 130 supplies the row decoder 111 with the output voltage "15 V" of the booster circuit 30 in response to an instruction from the control unit 120. The row decoder 111 applies a word line of an associated row address with the high voltage supplied from the voltage converter circuit 130. This results in collective erasure of information stored in memory cells corresponding to the associated row address.

In the foregoing manner, in this embodiment, the high voltage generated by the booster circuit 30 for electronic tuning is also used for writing data into and erasing data from the flash memory 100. This eliminates the need for providing a booster circuit such as a charge pump circuit on a semiconductor substrate, on which the flash memory 100 is fabricated, for generating a high voltage for use in writing and erasure, resulting in a reduction in the size of the flash memory 100.

The radio receiver 70 according to the first embodiment provides the following advantages.

(1) Since channel selection information is held by use of the flash memory 100 even if the supplied current is interrupted, the channel selection information is prevented from erasure. Also, since the high voltage for writing data into or erasing data from the flash memory 100 is generated from the boosted voltage generated by the booster circuit 30 used for ensuring a control voltage for the voltage controlled oscillator, a reduction in the size of the electronic tuning system is promoted.

(2) Since a DC-DC converter is used for the booster circuit 30, a highly efficient boosting operation can be implemented in an extremely simple configuration.

(Second Embodiment)

Figure 3:
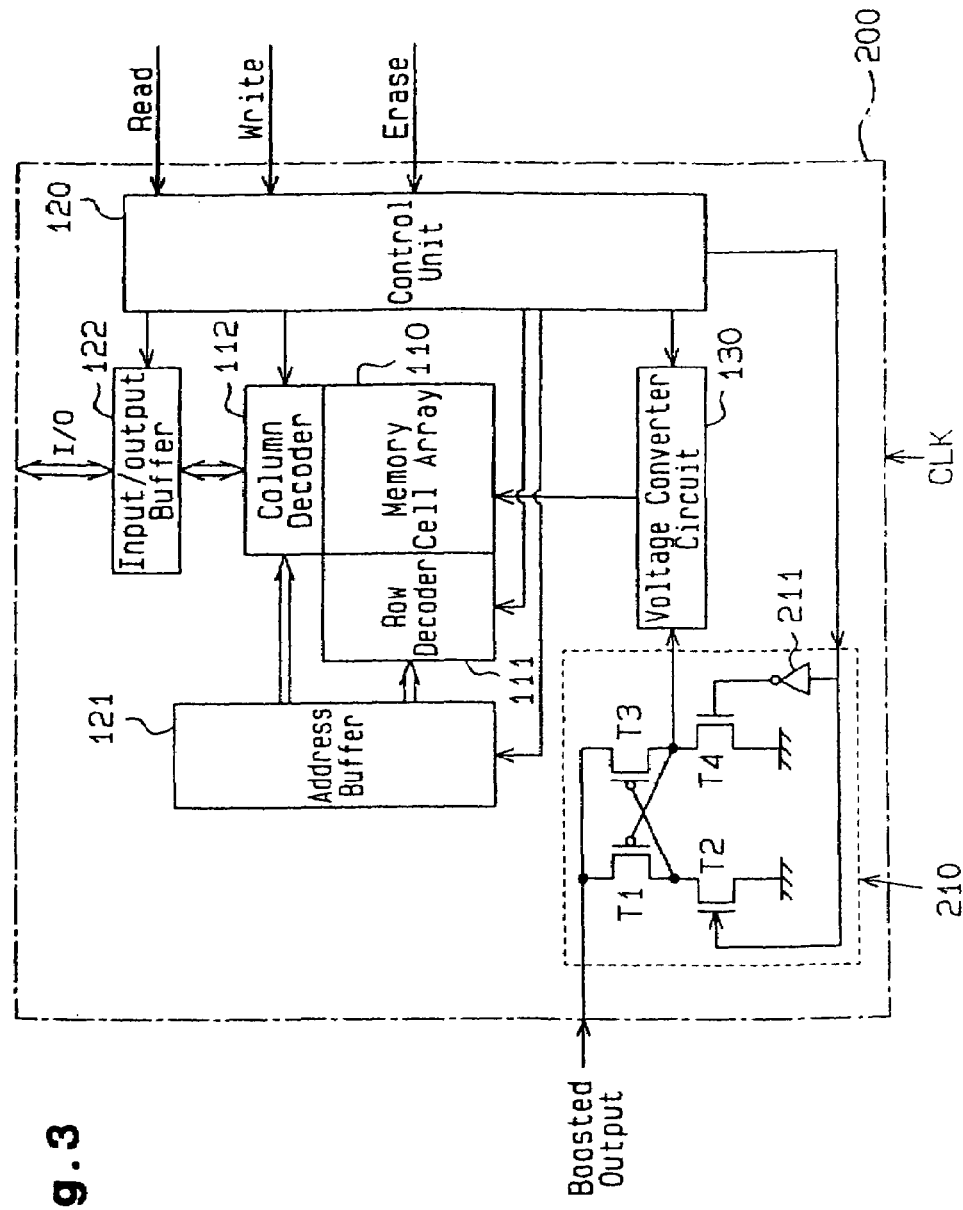
FIG. 3 is a schematic block diagram of a flash memory of a portable radio receiver according to a second embodiment of the present invention.

In the following, a portable radio receiver according to a second embodiment of the present invention will be described with reference to FIG. 3, centered on differences with the first embodiment. The electronic tuning system of the present invention is also applied to the radio receiver of the second embodiment.

In the second embodiment, a protection switch 210 is coupled between the booster circuit 30 and the voltage converter circuit 130. The protection switch 210 supplies the voltage converter circuit 130 with a boosted voltage in response to a write (or erase) request to a flash memory 200. Therefore, the protection switch 210 relieves a stress applied on the voltage converter circuit 130.

When the flash memory 200 requires the boosted voltage from the booster circuit 30 in the write mode or the erase mode, the protection switch 210 supplies the voltage converter circuit 130 with the boosted voltage by conducting between the voltage converter circuit 130 and the booster circuit 30. The protection switch 210 is controlled by a control unit 120, such that a boosted voltage input terminal of the voltage converter circuit 130 is selectively coupled to the booster circuit 30 or the ground.

Specifically, the protection switch 210 connects the output terminal of the booster circuit 30 to the input terminal of the voltage converter circuit 130 when the protection switch 210 receives a signal having a logical "H" level from the control unit 120. The protection switch 210 electrically disconnects the output terminal of the booster circuit 30 from the input terminal of the voltage converter circuit 130 to ground the input terminal of the voltage converter circuit 130 when the protection switch 210 receives a signal having a logical "L" level from the control unit 120. The protection switch 210 includes a p-channel transistor T1, an n-channel transistor T2, a p-channel transistors T3, an n-channel transistor T4, and an inverter 211.

The radio receiver according to the second embodiment provides the following advantages.

The provision of the protection switch 120 relieves a stress applied to the voltage converter circuit 130 and hence a stress applied to the flash memory 200.

The second embodiment may be modified in the following manner.

The protection switch 210 may be coupled external to the flash memory 200.

It should be apparent to those skilled in the art that the present invention may be embodied in many other specific forms without departing from the spirit or scope of the invention. Particularly, it should be understood that the invention may be embodied in the following forms.

Not limited to a DC-DC converter, another one, for example, a charge pump circuit may be used as the booster circuit.

In place of the flash memory, arbitrary non-volatile memories may be used. In this event, for reducing the size and power consumption of the electronic tuning system having a non-volatile memory, a voltage for use in writing channel selection information into the non-volatile memory is preferably generated from the booster circuit for ensuring a control voltage for the voltage controlled oscillator.

Not limited to the PLL, electronic tuning schemes may be employed such as a frequency synthesizer including a direct digital synthesizer, a voltage synthesizer, and the like.

A booster circuit may be fabricated on a semiconductor substrate of the non-volatile memory such that a control voltage for the voltage controlled oscillator is ensured from a boosted voltage of the booster circuit.

A mixed frequency signal of the mixer 11 may be generated by a method other than the subtraction of a frequency signal received by the antenna from the frequency signal oscillated by the local oscillator 20.

The electronic tuning system of the present invention may be applied not only to radio receivers but also to television receivers and transceivers, by way of example.

Therefore, the present examples and embodiments are to be considered as illustrative and not restrictive and the invention is not to be limited to the details given herein, but may be modified within the scope and equivalence of the appended claims.

What is claimed is:

1. An electronic tuning system comprising:
   a voltage controlled oscillator for generating a local frequency signal having a frequency according to a predetermined control voltage;
   an electronic tuner coupled to the voltage controlled oscillator for adjusting the predetermined control voltage to tune the local frequency signal to radio waves on an arbitrary channel in accordance with channel selection information;
   a booster circuit coupled to the voltage controlled oscillator for boosting a source voltage to generate a boosted voltage in order to ensure the predetermined control voltage, wherein the booster circuit includes,
      a coil coupled to a power source;
      a switching element coupled to the coil for periodically conducting a DC current flowing through the coil to a ground to change the DC current;
      a zener diode coupled to the coil for clamping an electromotive force induced in the coil in accordance with a change in the DC current flowing through the coil to a predetermined voltage; and
      a capacitor for smoothing the clamped voltage to generate a boosted-voltage; and
   a non-volatile memory for storing the channel selection information in response to a predetermined write voltage, wherein the boosted voltage of the booster circuit is utilized as the predetermined write voltage, wherein the capacitor is coupled between the non-volatile memory and a node between the zener diode and the voltage controlled oscillator.

2. The electronic tuning system according to claim 1, wherein the electronic tuner includes:
   a frequency divider coupled to the voltage controlled oscillator for dividing the local frequency signal in accordance with a predetermined frequency division ratio to generate a divided local frequency signal;
   a phase comparator coupled to the frequency divider for comparing the frequency and phase of the divided local frequency signal with the frequency and phase of a reference frequency signal to generate a voltage signal proportional to the frequency difference and the phase difference; and
   a low-pass filter coupled to the phase comparator for filtering a voltage signal to generate a filtered voltage signal, wherein the predetermined control voltage is generated by adding the boosted voltage to the voltage of the filtered voltage signal, and the channel selection information includes information on the predetermined frequency division ratio supplied to the frequency divider.

3. The electronic tuning system according to claim 2, wherein the voltage controlled oscillator includes:
   a varactor diode which varies its capacitance in response to the predetermined control voltage; and
   a local oscillator coupled to the varactor diode for generating a local frequency signal having a frequency in accordance with the capacitance of the varactor diode.

4. The electronic tuning system according to claim 1, further comprising:
   a voltage supply control circuit coupled to the booster circuit for supplying the boosted voltage to the non-volatile memory in response to a request for writing the channel selection information into the non-volatile memory.

5. The electronic tuning system according to claim 1, wherein the non-volatile memory includes a flash memory which receives the boosted voltage from the booster circuit to generate an erasure voltage and a write voltage.

6. The electronic tuning system according to claim 1, wherein the non-volatile memory includes a voltage converter circuit coupled to the booster circuit for receiving the boosted voltage from the booster circuit to generate an erasure voltage and a write voltage.

7. The electronic tuning system according to claim 6, further comprising a voltage supply control circuit coupled between the booster circuit and the voltage converter circuit for supplying the boosted voltage to the voltage converter circuit in response to a request for writing the channel selection information into the non-volatile memory.

8. A radio receiver comprising:
   a voltage controlled oscillator for generating a local frequency signal having a frequency in accordance with a predetermined control voltage;
   a mixer coupled to the voltage controlled oscillator for mixing a received signal with a local frequency signal to generate a mixed frequency signal;
   an intermediate frequency filter coupled to the mixer for filtering the mixed frequency signal to generate an intermediate frequency signal;
   a detector circuit coupled to the intermediate frequency filter for demodulating the intermediate frequency signal to an audio signal;
   an electronic tuner coupled to the voltage controlled oscillator for adjusting the predetermined control voltage to tune the local frequency signal to radio waves on an arbitrary channel in accordance with channel selection information;
   a booster circuit coupled to the voltage controlled oscillator for boosting a source voltage to generate a boosted voltage in order to ensure a predetermined control voltage, wherein the booster circuit includes,
      a coil coupled to a power source;
      a switching element coupled to the coil for periodically conducting a DC current flowing through the coil to a ground to change the DC current;
      a zener diode coupled to the coil for clamping an electromotive force induced in the coil in accordance with a change in the DC current flowing through the coil to a predetermined voltage; and
      a capacitor for smoothing the clamped voltage to generate a boosted voltage; and
   a non-volatile memory for storing the channel selection information in accordance with a predetermined write voltage, wherein the boosted voltage of the booster circuit is utilized as the predetermined write voltage, wherein the capacitor is coupled between the non-volatile memory and a node between the zener diode and the voltage controlled oscillator.

9. The radio receiver according to claim 8, wherein the electronic tuner includes:
   a frequency divider coupled to the voltage controlled oscillator for dividing the local frequency signal in accordance with a predetermined frequency division ratio to generate a divided local frequency signal;
   a phase comparator coupled to the frequency divider for comparing the frequency and phase of the divided local frequency signal with the frequency and phase of a reference frequency signal to generate a voltage signal proportional to the frequency difference and the phase difference; and
   a low-pass filter coupled to the phase comparator for filtering a voltage signal to generate a filtered voltage signal, wherein the predetermined control voltage is generated by adding the boosted voltage to the voltage of the filtered voltage signal, and the channel selection information includes information on the predetermined frequency division ratio supplied to the frequency divider.

* * * * *